United States Patent [19]
Arai

[11] Patent Number: 5,103,185
[45] Date of Patent: Apr. 7, 1992

[54] CLOCK JITTER SUPPRESSING CIRCUIT
[75] Inventor: Masanobu Arai, Tokyo, Japan
[73] Assignee: NEC Corporation, Tokyo, Japan
[21] Appl. No.: 583,289
[22] Filed: Sep. 17, 1990
[30] Foreign Application Priority Data
Sep. 22, 1989 [JP] Japan .................... 1-245062
[51] Int. Cl.⁵ ................ H03K 17/16; H03K 5/159
[52] U.S. Cl. ........................ 328/165; 377/45;
328/55; 307/597; 307/269
[58] Field of Search ............ 328/55, 165, 63;
377/45, 43; 307/520, 269, 597

[56]           References Cited
          U.S. PATENT DOCUMENTS

| | | | |
|---|---|---|---|
| 3,983,498 | 9/1976 | Malek | 328/55 |
| 4,290,022 | 9/1981 | Puckette | 328/55 |
| 4,700,347 | 10/1987 | Rettberg et al. | 328/55 |
| 4,713,621 | 12/1987 | Nakamura et al. | 307/269 |
| 4,757,264 | 7/1988 | Lee et al. | 328/63 |
| 4,812,783 | 3/1989 | Honjo et al. | 331/20 |
| 4,868,430 | 9/1989 | Stewart | 377/45 |

*Primary Examiner*—John S. Heyman
*Attorney, Agent, or Firm*—Helfgott & Karas

[57] ABSTRACT

A clock jitter suppressing circuit includes a control circuit, a delay circuit, and a selection circuit. The delay circuit sequentially delays a clock signal at time intervals sufficiently shorter than the period of the clock signal. The selection circuit selects and outputs one of delay outputs from the delay circuit which is determined in accordance with a selection signal. The control circuit generates a selection signal for selecting a predetermined delay output when no jitter is caused in the clock signal. Every time jitter is caused in the clock signal, the control circuit generates a selection signal for selecting a delay output which is shifted by an amount corresponding to the phase amount of the jitter in a direction to cancel a polarity of the jitter.

3 Claims, 5 Drawing Sheets

CLOCK JITTER SUPPRESSING CIRCUIT

BACKGROUND OF THE INVENTION

The present invention relates to a clock jitter suppressing circuit for suppressing jitter of a clock signal used in a transmission circuit and the like.

In a digital circuit such as a transmission circuit, a clock signal is generally used to set proper timings of various signals. Such a clock signal normally includes phase jitter in which the phase varies over time due to various causes. Control of circuit at accurate timings is interfered with by such jitter. For this reason, a phase-locked loop circuit (to be referred to as a PLL circuit hereinafter) has been used to suppress such phase jitter and obtain a proper clock signal. As such a PLL circuit, an analog PLL circuit has been used, which comprises, e.g., a voltage-controlled oscillator, a low-pass filter, and a feedback circuit.

With the recent remarkable advances in micropatterning of digital ICs, digital circuits having various functions are integrated. However, since such an IC process cannot be directly applied to the above-mentioned analog PLL circuit, a digital PLL circuit formed by digitization based on the principle of an analog PLL has been proposed.

In such a conventional digital PLL circuit, however, processing is simply digitized, and the basic arrangement is still constituted by a feedback circuit and a low-pass filter. With this arrangement, since a transfer function for control is based on an analog quantity in the amplitude direction, the processing and the circuit are inevitably complicated. In addition, if qauntization is forcibly performed to simplify the processing, satisfactory characteristics cannot be obtained.

SUMMARY OF THE INVENTION

It is, therefore, an object of the present invention to provide a clock jitter suppressing circuit which can perform digital processing with a simple arrangement and can perform any necessary digital processing without a combination of a low-pass filter and a feedback circuit.

In order to achieve the above object, according to the first aspect of the present invention, there is provided a clock jitter suppressing circuit comprising delay means for sequentially delaying a clock signal at time intervals sufficiently shorter than a period of the clock signal and outputting respective delay outputs, selection means for selecting and outputting one of the delay outputs from the delay means which is determined in accordance with a selection signal, and control means for generating a selection signal for selecting a predetermined one of the delay outputs when no jitter is caused in the clock signal, and every time jitter is caused in the clock signal, generating a selection signal for selecting a delay output which is shifted by an amount corresponding to a phase amount of the jitter in a direction to cancel a polarity of the jitter.

According to the second aspect of the present invention, the control means according to the first aspect is constituted by jitter detection means for generating an up/down count signal in a direction to cancel a phase jitter component in accordance with a polarity and a phase amount of the phase jitter component, and an up/down counter for performing a count operation in accordance with the up/down count signal.

According to the third aspect of the present invention, whether to generate an up count signal or a down count signal depends on whether the period of the clock signal is longer or shorter than a predetermined value. More specifically, the jitter detection means according to the second aspect is constituted by count means for counting the clock signal by using a pulse having a frequency sufficiently larger than that of the clock signal, and up/down signal generating means for generating a down count signal when the count result from the count means is larger than a predetermined value, and generating an up count signal when the count result is smaller than the predetermined value.

According to the fourth aspect of the present invention, the jitter detection means according to the second aspect is designed such that an up/down count signal has upper and lower limit values.

BRIEF DESCRIPTION OF THE DRAWINGS

FIGS. 4(a) to 4(k) are timing charts for explaining operations of the circuits in FIGS. 1 and 2;

FIGS. 6(a) to 6(j) are timing charts for explaining an operation of the circuit in FIG. 5.

DESCRIPTION OF THE PREFERRED EMBODIMENTS

Figure 1:
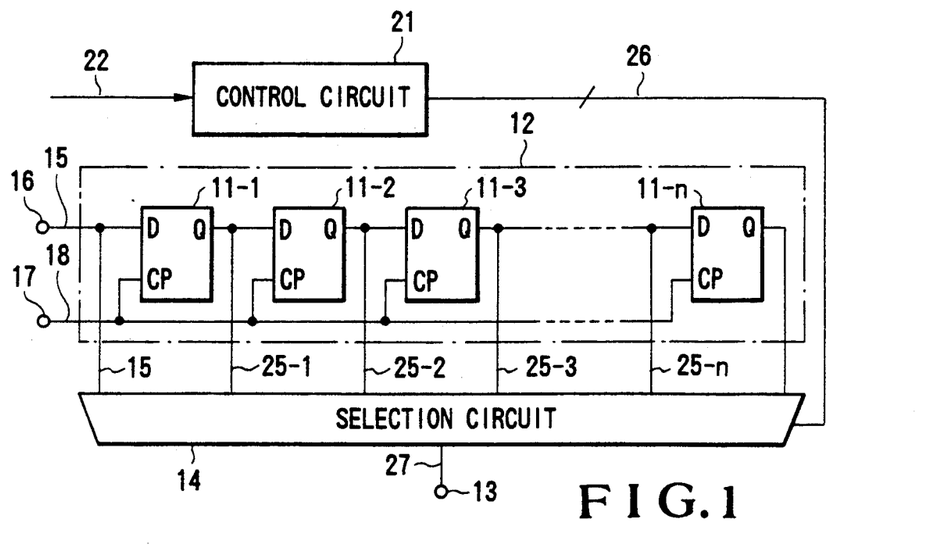
FIG. 1 is a circuit diagram showing the first embodiment of the present invention.

FIG. 1 shows the first embodiment of the resent invention. A circuit of this embodiment includes a shift register 12 constituted by n D-type flip-flops (to be referred to as flip-flops hereinafter) 11-1 to 11-n. An output terminal Q of each flip-flop is connected to a selection circuit 14 having an output terminal 13. A clock signal 15 having phase jitter to be suppressed is input to an input terminal D of the flip-flop 11-1 through a first input terminal 16 and is also supplied to the selection circuit 14.

A shift clock signal 18 having a sufficiently higher frequency than the clock signal 15 is input from a second input terminal 17 and is supplied to a clock terminal CP of each of the flip-flops 11-1 to 11-n. A control circuit 21 is connected to the selection circuit 14 so as to supply, to the selection circuit 14, a selection signal 26 for selecting one of output signals from the shift register 12 on the basis of a signal 22 associated with phase jitter information supplied from a circuit (not shown) of the preceding stage.

An operation of this circuit will be described with reference to FIG. 4. For the sake of a simple description, assume that the clock signal 15 having phase jitter components A and B (FIG. 4(a)) each corresponding to one period t of the shift clock signal 18 (FIG. 4(b)) is input to the input terminal D of the flip-flop 11-1. Since the flip-flop 11-1 is designed to receive an input signal at the rise timing of a shift clock signal, the input signal is received at a rise timing $T_1$ of the shift clock signal 18 and is output as a first shift signal 25-1 (FIG. 4(c-1)).

Figure 4:
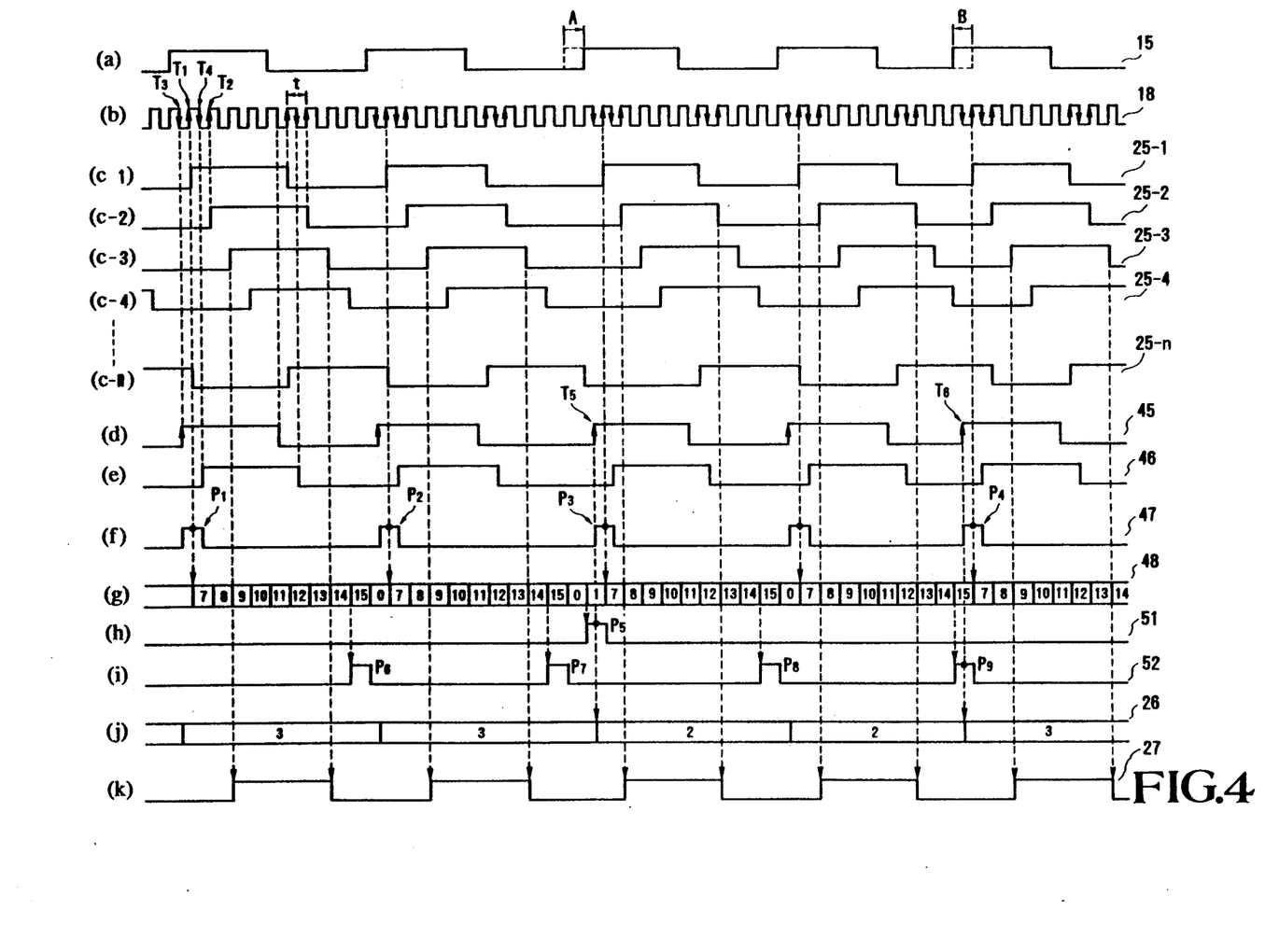

When this signal is input to an input terminal D of the flip-flop 11-2, the input signal is received at a timing $T_2$ and is output as a second shift signal 25-2 (FIG. 4(c-2)). Subsequently, third to nth shift signals 25-3 to 25-n are output in the same manner as described above. With this operation, the selection circuit 14 receives the n shift signals 25-1 to 25-n, the respective adjacent signals of which have phases shifted from each other by short times t.

The control circuit 21 is designed to output the selection signal 26 for selecting an output from substantially the middle portion of the shift register 12, i.e., the (n/2)th flip-flop. Upon reception of the signal 22 associated with phase jitter information from the circuit (not shown) of the preceding stage, the control circuit 21 supplies, to the selection circuit 14, the selection signal 26 which is phase-shifted by an amount corresponding to the jitter information in a direction opposite to the polarity of the jitter. The selection circuit 14 selects a signal selected by the selection signal 26 from output signals from the flip-flop 11-1 to 11-n and outputs a pure signal 27 having no phase jitter.

Assume that the shift register 12 is constituted by six flip-flops, and the control circuit 21 outputs a signal (FIG. 4(j)), representing "3", for selecting an output from the third flip-flop 11-3 located in the middle of the shift register 12. If a jitter component appears at a position indicated by reference symbol A in the clock signal 15 (FIG. 4(a)), and the clock signal 15 is delayed by the time t (corresponding to one shift), the delay can be corrected by advancing the phase of an output clock signal by one shift. Therefore, if the value of the selection signal 26 is changed from "3" to "2", a clock signal which is advanced by one shift is output (FIG. 4(j)), thus correcting the delay. That is, the signal 25-2 is selected and output in place of the previously selected signal 25-3.

Similarly, when a jitter component subsequently appears at a position indicated by reference symbol B in FIG. 4(a), and the phase advances by the time t (one shift), the value of the selection signal is changed from "2" to "3" (FIG. 4(j)). As a result, a signal having a phase delayed from the phase of the previous signal by one shift is selected and output. That is, the signal 25-3 is selected and output in place of the signal 25-2.

Every time phase jitter is produced, one of six output signals from the shift register 12 is selected by the selection signal 26 in accordance with the magnitude and polarity of the jitter component and is output as a clock signal having no phase jitter.

Figure 2:
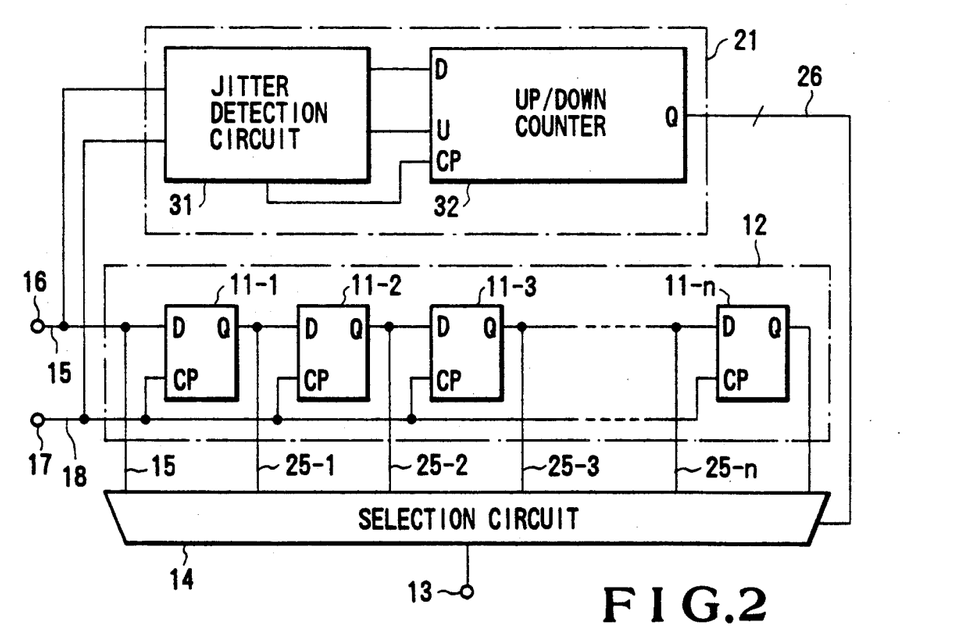
FIG. 2 is a circuit diagram showing the second embodiment of the present invention.

FIG. 2 shows the second embodiment of the present invention. A circuit of this embodiment includes a shift register 12 having n flip-flops and a selection circuit 14 similar to those in the first embodiment. Since these components have the same arrangements as those of the components in the first embodiment, a description thereof will be omitted. A control circuit 21 of this circuit includes a jitter detection circuit 31 and an up/down counter 32. The control circuit 21 receives a clock signal 15 and a shift clock signal 18 through first and second input terminals 16 and 17 and outputs a selection signal 26 for selecting one of n shift signals output from the shift register 12. This selection signal 26 is input to the selection circuit 14 in the same manner as in the first embodiment.

Figure 3:
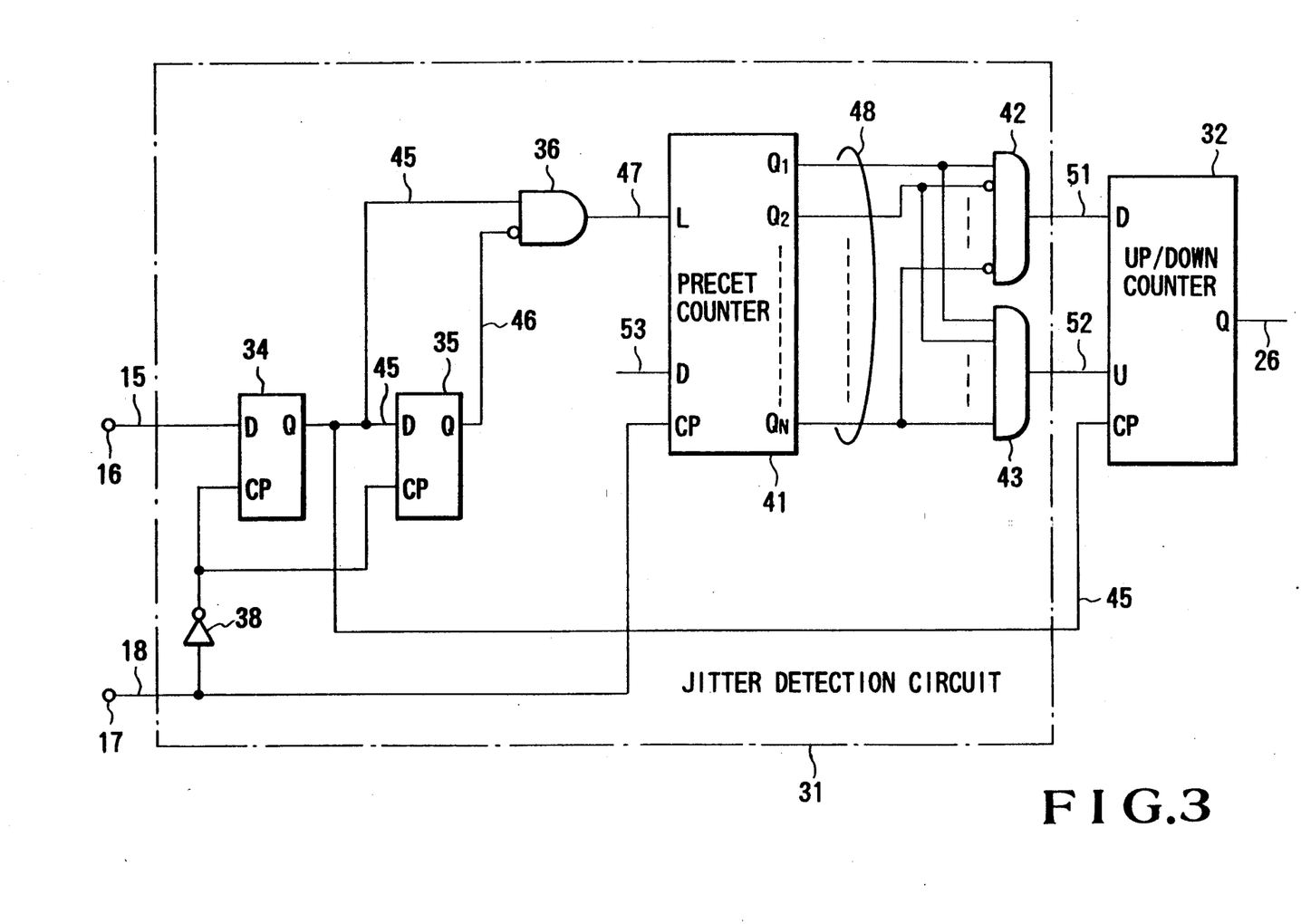
FIG. 3 is a circuit diagram showing a detailed arrangement of a control circuit 21 in FIG. 2.

An operation of this circuit will be described below. FIG. 3 shows the control circuit 21 in detail. This circuit includes the jitter detection circuit 31 and the up/down counter 32. The jitter detection circuit 31 includes two D-type flip-flops. An input terminal D of a first flip-flop 34 of the two flip-flops is connected to the first input terminal 16 so as to receive the clock signal 15. An output from the output terminal Q is branched in three directions and is connected to an input terminal D of a second flip-flop 35, a clock terminal CP of the up/down counter 32, and one input terminal of an AND circuit 36. Clock terminals CP of these flip-flops 34 and 35 are connected to the input terminal 17 through an inverter 38 so as to receive the shift clock signal 18. In addition, an output terminal Q of the flip-flop 35 is connected to the negative logic input terminal of the AND circuit 36.

The output terminal of the AND circuit 36 is connected to an input terminal L of a counter 41 having output terminals $Q_I$ to $Q_N$. The counter 41 increments the shift clock signal 18 input to the clock terminal CP through the input terminal 17. In addition, data 53 represented by formula (1) is supplied to a preset data input terminal D:

$$2^N - M + 1 \tag{1}$$

The preset counter 41 is preset to the value of the data 53 at the rise timing of the shift clock signal 18 only when an input to the input terminal L is set at "1" level. In formula (1), M is the ratio of the frequency of the shift signal 18 to that of the clock signal 15 and is normally set to be as large as 10 or more.

Each of the output terminals of $Q_I$ to $Q_N$ of N bits is branched in two directions to be connected to first and second N-input AND circuits 42 and 43. All the input terminals of the first N-input AND circuit 42 except for the one corresponding to the output terminal $Q_I$ are negative logic inputs. The output terminals of these N-input AND circuits 42 and 43 are respectively connected to a down count terminal D and an up count terminal U of the up/down counter 32. An output terminal Q of the up/down counter 32 is connected to the selection circuit 14 (FIG. 2). Note that the number of bits of this output terminal Q is set to allow selection of any of flip-flop outputs from the shift register 12.

A down input signal 51 or an up input signal 52 supplied to the down counter terminal D or the up counter terminal U is counted at the rise timing of a signal 45 output from the flip-flop 34.

In the jitter detection circuit denoted by reference numeral 31 in FIG. 3, the components other than the AND circuits 42 and 43 constitute a count means for counting the clock signal by using a pulse having a frequency sufficiently higher than that of the clock signal, and the AND circuits 42 and 43 constitute an up/down signal generating means for generating a down count signal when the count result from the count means is larger than a predetermined value, and generating an up count signal when the count result is smaller than the predetermined value.

An operation of the control circuit 21 will be described below with reference to FIG. 4. The clock signal 15 input to the input terminal D of the flip-flop 34 is received at the rise timing of a shift clock signal whose polarity is inverted by the inverter 38, i.e., at a fall timing $T_3$ (FIG. 4(b)) of the shift clock signal 18. The received signal is then output as the signal 45 (FIG. 4(d)) from the output terminal Q. This signal is received as a signal 46 (FIG. 4(e)) by the flip-flop 35 at a timing $T_4$.

As a result, a signal 47 output from the AND circuit 36 becomes a pulse signal shown in FIG. 4(f). The counter 41 fetches the data 53 represented by formula (1), which is supplied to the preset data input terminal D, at the rise timing of the shift clock signal 18 so as to be preset only when the signal 47 supplied to the input terminal L is at "1" level. For the sake of a simple description, the values of M and N are set according to formula (2):

$$M = 10, N = 4 \qquad (2)$$

That is, it is assumed that the period of the clock signal 15 corresponds to ten periods of the shift clock signal 18, and the counter 41 has a 4-bit output terminal. With this assumption, the value of formula (1) becomes "7". When a pulse $P_l$ of the signal 47 (FIG. 4(f)) is received at the rise timing of the shift clock signal 18, the counter 41 is preset, and its output signal 48 is immediately set to be "7". Subsequently, the value of the signal 48 is sequentially incremented as "8", "9", "10", . . . every time a shift clock signal is generated.

If no jitter is included in the clock signal 15, the counter 41 is preset to "7" again by a next pulse $P_2$ when counting is performed ten times up to count "0". Since all the bits of the count output signal 48 are set at "1" level at count "15" during this period, the up input signal 52 output from the N-input AND circuit 43 is set at "1" level (FIG. 4(j), $P_6$). Subsequently, the up input signal 52 is set at "1" every time count "15" is counted (FIG. 4(i), $P_7$, $P_8$, $P_9$).

If a phase delayed jitter component A (FIG. 4(a)) is present, the counter 41 is preset again by a next pulse $P_3$ (FIG. 4(a)) when counting is performed 11 times from count "7" to which the counter 41 is preset by the pulse $P_2$ (FIG. 4(f)) to count "1". At this time, i.e., when count "1" is set, only the bit $Q_l$ of the count output signal 48 is set at "1" level, and all the other bits are set at "0" level. For this reason, the down input signal 51 output from the N-input AND circuit 42 is set at "1" level (FIG. 4(h), $P_5$).

These down and up input signals 51 and 52 are respectively supplied to the up and down counter terminals U and D of the up/down counter 32. However, these pulse signals are counted only at the rise timing of the signal 45 (FIG. 4(d)) supplied to the clock terminal CP. For this reason, a pulse $P_5$ of the down input signal 51 is received at a rise timing $T_5$ of the signal 45 and is one decrement operation is performed. With this operation, the value of the selection signal, which has been set to be "3" as in the first embodiment, is changed to "2" (FIG. 4(j)).

If a phase advanced jitter component B (FIG. 4(a)) is present, the counter 41 is preset by a next pulse $P_4$ when counting is performed nine times from count "7" to count "15" (FIGS. 4(f) and 4(g)). At this time, i.e., when count "15" is set, the up input signal 52 output from the N-input AND circuit 43 is set at "1" level (FIG. 4(i)) as described above, but a pulse $P_9$ thereof is received at a rise timing $T_6$ of the signal 45 (FIG. 4(d)) and one increment operation is performed. If, for example, the selection signal 26 has represented "2", this value is changed to "3" (FIG. 4(j)). Note that since the pulses $P_6$, $P_7$, and $P_8$ of the up input signal 52 appear at timings different from the rise timing of the signal 45, they are not counted. As a result, the changes in value of the selection signal 26 are represented as follows (FIG. 4(j)):

$$\text{"3", "3", "2", "2", "3"} \qquad (3)$$

In the selection circuit 14 (FIG. 2), when the selection signal 26 represents "3", an output signal 25-3 from the shift register 12 is output from the output terminal 13, whereas when it represents "2", a signal 25-2 is selected and output from the output terminal 13 (FIG. 4(k)). In this manner, the phase jitter of the clock signal 15 can be suppressed to obtain a clock signal having a proper waveform.

Figure 5:
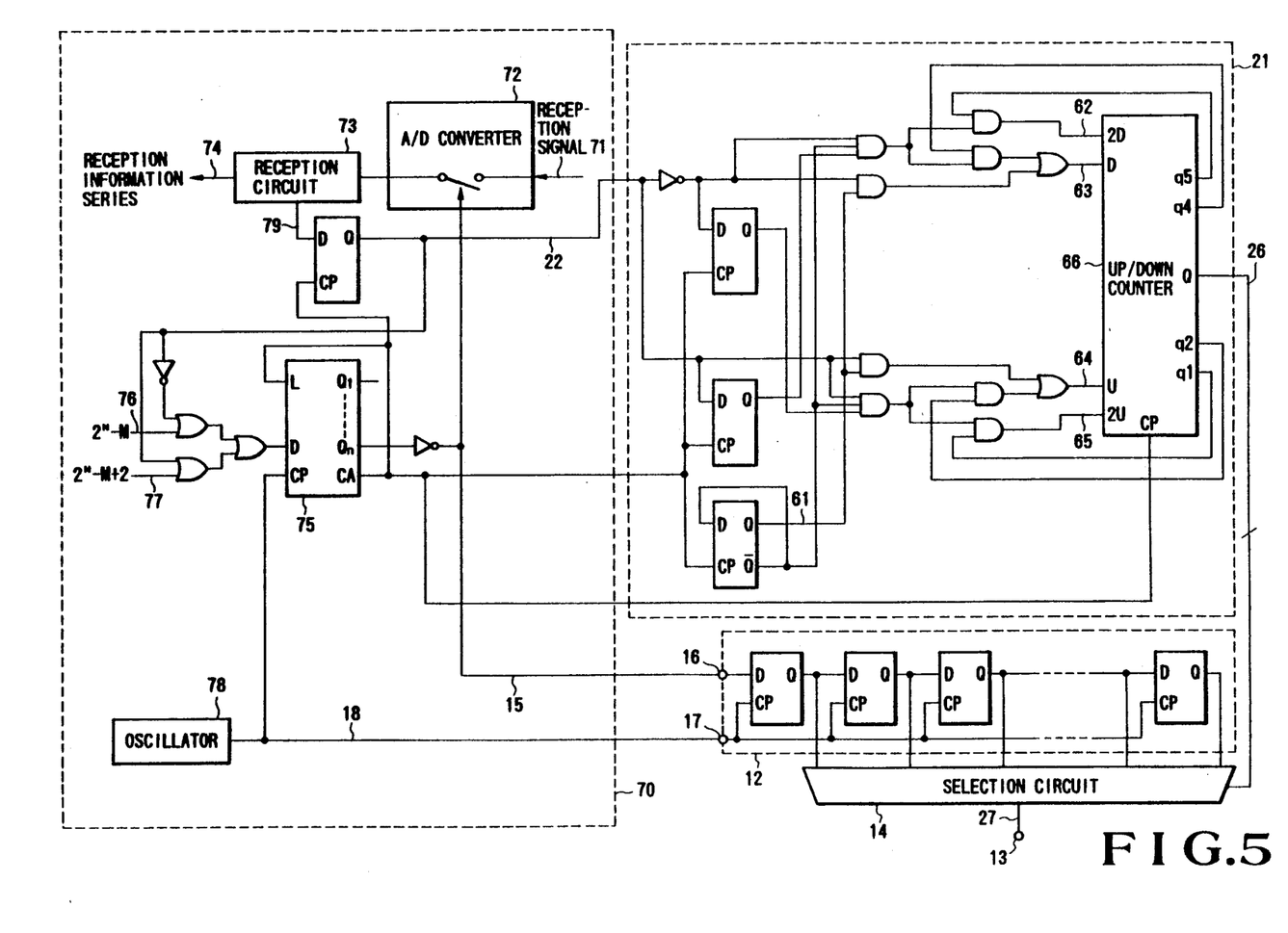
FIG. 5 is a circuit diagram showing the third embodiment of the present invention.

FIG. 5 shows the third embodiment of the present invention. In this embodiment, the control circuit 21 is modified to prevent overflow or underflow of an up/down counter even if jitter components having negative and positive polarities appear in different frequencies.

Referring to FIG. 5, reference numeral 70 denotes a signal generating circuit. Although not all the components of this circuit are directly associated with the present invention, a description thereof will be made to explain a case wherein positive and negative jitter polarities appear in different frequencies. In the signal generating circuit 70, reference numeral 71 denotes a reception signal transmitted through a transmission path. The waveform of this signal tends to be distorted in the transmission path. For this reason, the signal 71 is sampled by an A/D converter 72 at the rise timing of a clock signal 15 in order to perform waveform shaping of the signal. Sampled signals are formed into a reception data series by a reception circuit 73. Such a reception circuit for a transmission signal is normally designed to extract a timing from a reception signal. The reception circuit 73 outputs timing information 79. The timing information 79 is set at "0" level and "1" level, respectively, when the sampling point of the A/D converter 72 is advanced and delayed from an optimal point.

Reference numeral 75 denotes a counter for counting M shift clock signals 18 and generating a clock signal used for sampling by the A/D converter 72. The counter 75 changes the count value by ±1 in accordance with "0"/"1" of the timing information so as to generate the clock signal 15 for setting the sampling value at the optimal point.

In such a reception circuit for a transmission signal, jitter may appear in the clock signal 15, and the ratio of the frequency of a reception signal to that of the shift clock 18 generated by an oscillator 78 may be slightly deviated from an integral ratio. If the ratio of the frequency of the clock signal 15 to that of the shift clock 18 is not an integer, and positive and negative jitter components appear in different frequencies in the clock signal 15, overflow or underflow may occur in the circuit of the second embodiment, and hence a perfect jitter suppressing operation cannot be guaranteed.

In the second embodiment, the control circuit 21 is designed to perform only an increment operation for advanced jitter and a decrement operation for delayed jitter so as to cancel the jitter. In contrast to this, the control circuit 21 in FIG. 5 is designed to additionally perform countermeasures against overflow and underflow in such a manner that the count value of an up/down counter 66 is returned to the center value. In this embodiment, a description will be made on the assumption that the clock signal 15 includes a positive or negative jitter component in every period.

When signals having the same phase are output from terminals $Q_n$ and CA of the counter 75, and an input signal is supplied to an input terminal D of the up/down counter 66, the count is decremented by one. When an input signal is supplied to a terminal 2D, the count is decremented by two. When an input signal is supplied to a terminal U, the count is incremented by one. When an input signal is supplied to a terminal 2U, the count is incremented by two. The up/down counter 66 has five types of output terminals. Similar to the second embodiment, a terminal Q of the counter 66 outputs a signal having bits required to select an output signal from a shift register 12. When data from the terminal Q represents "2", an output from a terminal q2 is set at "1" level. When the data represents "1" or less, a terminal q1 is set at "1" level. When the data represents "4", a terminal q4 is set at "1". When the data represents "5" or more, a terminal q5 is set at "1" level.

Referring to FIG. 5, since the signals from the terminal $Q_n$ and the terminal CA of the flip-flop 75 have the same phase, the frequency of the clock signal 61 is ½ that of the clock signal 15.

The circuit shown in FIG. 5 is designed such that when the clock signal 61 is set at "1" level and "0" level, count operations shown in Table 1 below are performed, respectively.

TABLE 1

| signal 61 | signal 22 | signal 28a* | selector value (count value) | counter operation | output jitter amount |
|---|---|---|---|---|---|
| "1" | "1" | — | — | increment by 1 | none |
| "0" | "0" | — | — | decrement by 1 | none |
| | "1" | "1" | — | no change | advance by 1 |
| | | | center value or more | no change | advance by 1 |
| | | "0" | center value −1 | increment by 1 | none |
| | | | center value −2 or less | increment by 2 | delay by 1 |
| | "0" | "0" | — | no change | delay by 1 |
| | | "1" | center value or less | no change | delay by 1 |
| | | | center value +1 | decrement by 1 | none |
| | | | center value +2 | decrement by 2 | advance by 1 |

In Table 1, the signal 22a* is the value of the signal 22 when the signal 61 is set at "1" level before the signal 22 has the values enclosed within the thick The following different operations are performed depending on the value of the signal 61.

(1) Signal 61 = "1"

In this case, increment and decrement operations are performed in the same manner as in the second embodiment. That is, if the signal 22 is set at "0" level, and a delayed jitter component appears in the clock signal 15, the up/down counter 66 is decremented by one. If the signal 22 is set at "1" level, and an advanced jitter component appears, the up/down counter is incremented by one. With this operation, an output from a selection circuit 14 includes no jitter.

(2) Signal 61 = "0"

In this case, operations of returning the count value of the up/down counter to the center value are performed in addition to cancellation of jitter. More specifically, when the signal 22 is set at "1" level, and an advanced jitter component appears in the clock signal 15, the counter 66 is to be incremented by one. If, however, the counter 66 is previously incremented by one when the signal 61 is at "1" level and the signal 22 is at "1" level, increment operations are continuously performed twice, resulting in overflow. For this reason, in such a case, no count operation for suppressing jitter is performed, and hence the count value is not changed. In addition, if the counter 66 is previously decremented by one when the signal 61 is at "1" level and the signal 22 is at "0" level, the counter 66 should be incremented by one to suppress jitter. In such a case, however, a count operation is performed in accordance with the count value to return the count value to the center value upon detecting that jitter corresponding to ±1 is caused in an output from the selection circuit 14.

That is, when the count value is equal to or larger than the center value, an increment operation is not performed, and the count value is not changed. In this case, an advanced jitter component appears in an output from the selection circuit 14. When the count value is equal to the center value −1, the counter 66 is incremented by one to prevent generation of jitter in an output from the selection circuit 14 and to set the count value to the center value. When the count value is equal to the center value −2, the counter 66 is incremented by two. In this case, although a delayed jitter component appears in an output from the selection circuit 14, the count values are caused to approach the center value by two at once.

Figure 6:
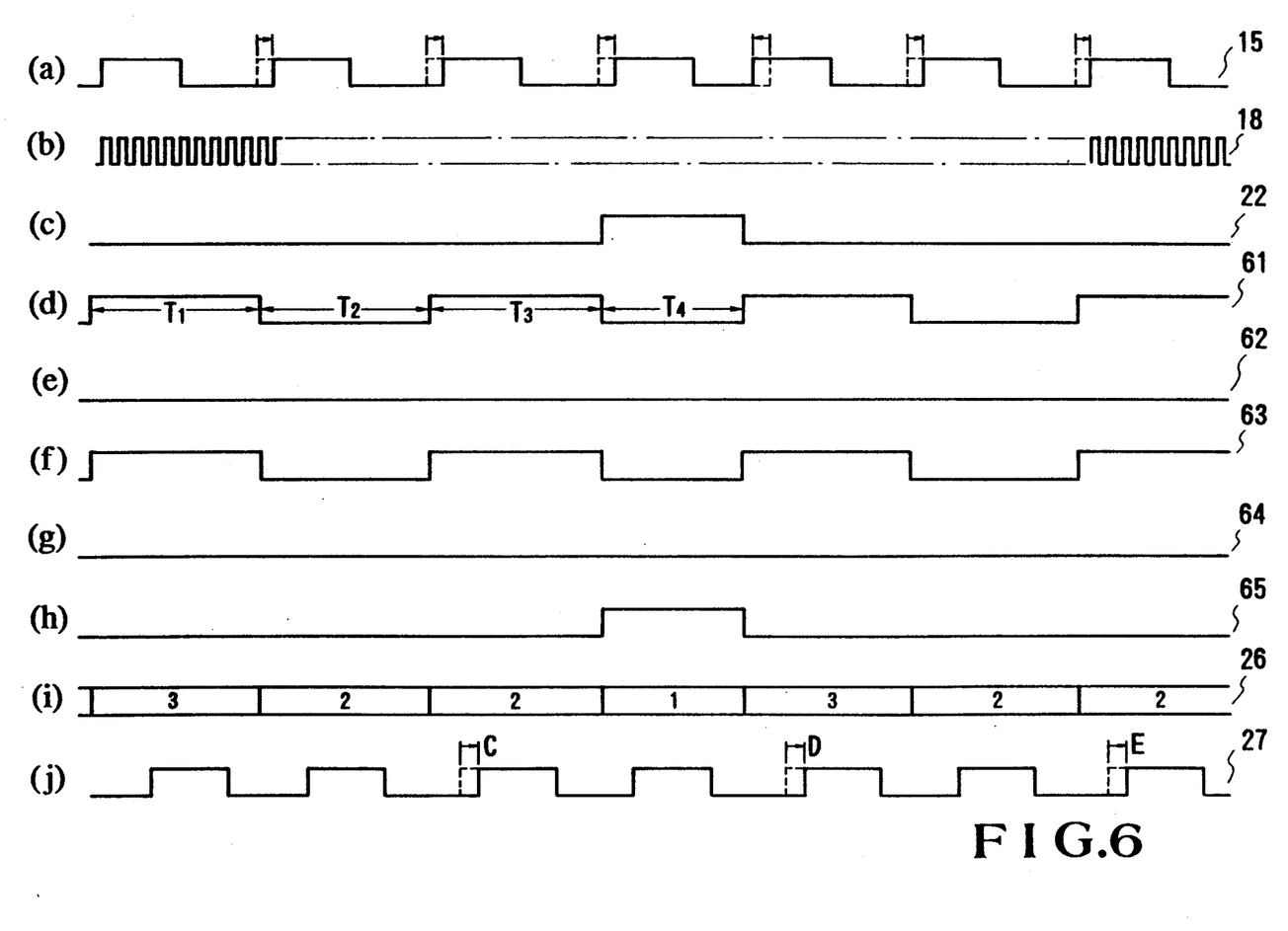

When the signal 22 is at "0" level, and a delayed jitter component appears in the clock signal 15, the above-described operations may be performed in a reverse manner. Note that the center value is set to be "3" in FIGS. 5 and 6.

FIGS. 6(a) to 6(j) are timing charts for explaining jitter suppressing operations when delayed, delayed, delayed, advanced, delayed, and delayed jitter components sequentially appear in the clock signal 15 in this order. In the circuit of the second embodiment, if the number of delayed jitter components is larger than that of advanced jitter components by four, the count value is changed from "3" to "−1" to cause underflow in the up/down counter.

In the third embodiment, no underflow occurs in the counter due to the operations shown in FIGS. 6(a) to 6(j), but jitter cannot be completely eliminated. However, jitter components appear in the output from the selection circuit 14 as "no change", "delayed", "no change", "delayed", "no change", and "delayed" in this manner, thus suppressing the jitter in the clock signal 15.

FIGS. 6(a) to 6(j) will be described in detail below. The count value is started from "3". Since the signal 61 is at "1" level (FIG. 6(d), $T_1$), and the signal 22 is at "0" level at this time, the up/down counter 66 is decremented by one according to Table 1, and the count value is changed to "2". At this time, jitter is suppressed. Subsequently, the signal 61 is set at "0" level, and the signal 22 is set at "0" level (FIG. 6(d), $T_2$) However, since the signal 22 is previously set at "0" level when the signal 61 is at "1" level, the count value "2" is not changed according to Table 1. As a result, a delayed jitter component denoted by reference symbol C in FIG. 6(j) appears in the output from the selection circuit 14.

Since the signal 61 is at "1" level (FIG. 6(d), $T_3$), and the signal 22 is at "0" level, the counter 66 is decremented by one, and the count value is set to be "1", thus suppressing the jitter component. The signal 61 is at "0" level (FIG. 6(d), $T_4$), and the signal 22 is at "1" level. Since the value of the signal 22 is "0" and the counter value is "1" which is equal to the center value −2 when the signal 61 is previously set at "1" level, the counter 66 is incremented by two according to Table 1. As a result, a delayed jitter component denoted by reference symbol D in FIG. 6(j) appears, but the count value returns to "3" as the center value. Thereafter, two operations are performed in the same manner as in the operations from the start.

In the third embodiment, if a jitter component having a given polarity appears in the clock signal 15 in every period, overflow or underflow of the up/down counter cannot be prevented. If jitter components having one polarity appear in a frequency not more than third times that of jitter components having the other polarity, overflow and underflow can be prevented. In a normal transmission path, the ratio of the frequency of the clock signal 15 to that of the shift clock 18 is only slightly deviated from an integral ratio. Therefore, such a condition can be easily satisfied.

As has been described above, in the third embodiment, if the relationship between the frequencies of the clock signal 15 and the shift clock 18 is deviated from an integral ratio, jitter can be effectively suppressed.

What is claimed is:

1. A clock jitter suppressing circuit comprising control means for generating a selection signal based on jitter information of a clock signal, delay means for sequentially delaying the clock signal and outputting respective delay outputs, and selection means for selecting one of the delay outputs on the basis of the selection signal, wherein said delay means sequentially delays the clock signal at time intervals sufficiently shorter than a period of the clock signal and outputs respective delay outputs, said selection means selects and outputs one of the delay outputs from said delay means which is determined in accordance with the selection signal.

said control means generates a selection signal for selecting a predetermined one of the delay outputs when no jitter is caused in the clock signal, and every time jitter is caused in the clock signal, generates a selection signal for selecting a delay output which is shifted by an amount corresponding to a phase amount of the jitter in a direction to cancel a polarity of the jitter, wherein said control means comprises jitter detecting means for generating an up/down count signal in a direction to cancel a phase jitter component in accordance with a polarity and a phase amount of the phase jitter component, and an up/down counter for performing a count operating in accordance with the up/down count signal, and is designed to output an up/down counter output as a selection signal.

2. A circuit according to claim 1, wherein said jitter detection means comprises count means for counting the clock signal by using a pulse having a frequency sufficiently larger than that of the clock signal, and up/down signal generating means for generating a down count signal when the count result from said count means is larger than a predetermined value, and generating an up count signal when the count result is smaller than the predetermined value.

3. A circuit according to claim 1, wherein said jitter detecting means is an up/down counter in which an up/down count signal has an upper limit value and a lower limit value.

* * * * *